United States Patent [19]
Bartholomew

[11] Patent Number: 5,696,803
[45] Date of Patent: Dec. 9, 1997

[54] BARREL SHIFTER AND METHOD OF MAKING SAME

[75] Inventor: John Howard Bartholomew, Austin, Tex.

[73] Assignee: Motorola, Inc., Schaumburg, Ill.

[21] Appl. No.: 694,653

[22] Filed: Aug. 7, 1996

[51] Int. Cl.$^6$ ................................................. G11C 19/00
[52] U.S. Cl. ........................................ 377/64; 364/715.08
[58] Field of Search ........................... 377/64; 364/715.08

[56] References Cited

U.S. PATENT DOCUMENTS

| | | | |
|---|---|---|---|
| 4,827,441 | 5/1989 | Someshwar et al. | 364/715.08 |
| 5,247,723 | 9/1993 | Murakami | 377/64 |
| 5,300,811 | 4/1994 | Suzuki et al. | 257/691 |
| 5,359,212 | 10/1994 | Kudou et al. | 257/211 |
| 5,555,519 | 9/1996 | Takashima et al. | 365/63 |
| 5,625,259 | 4/1997 | Satou et al. | 395/800 |

OTHER PUBLICATIONS

Carver Mead, et al., "Introduction to VLSI Systems", pub. by Addison–Wesley Pub. Co., Inc. 1980, Section 5.8 Barrel Shifter, pp. 157–163.

Neil H.E. Weste, et al, "Priciples of CMOS VLSI Design—A Systems Perspective", 2nd Edition, pub. by Addison–Wesley Pub. Co., 1993 by AT&T, pp. 560–563.

*Primary Examiner*—Margaret Rose Wambach
*Attorney, Agent, or Firm*—Ken Seddon; Daniel D. Hill

[57] ABSTRACT

A CMOS (complementary metal-oxide semiconductor) barrel shifter (40) is implemented using a plurality of cells (41–43, 58) for shifting bits of data. Each of the cells (41–43, 58) has two transistors (44–47, 49–52) and both transistors of each cell are of the same conductivity type. The four transistors (44–47) of two neighboring cells (41,42) are formed using a common active region (60). The layout design of the barrel shifter (40) is such that all of the transistors of one conductivity type are grouped together, and all of the transistors of the opposite conductivity type are grouped together and are formed in a single well region (55).

17 Claims, 2 Drawing Sheets

BARREL SHIFTER AND METHOD OF MAKING SAME

FIELD OF THE INVENTION

This invention relates, in general, to integrated circuit layout, and more particularly to a layout for a barrel shifter.

BACKGROUND OF THE INVENTION

In many digital processing tasks, the ability to shift a digital word a predetermined number of bits in one direction or another is required. A simple example is the division of a digital data word by two. This is accomplished by a right shift of the bits by one place with a zero filling the vacated most significant bit.

This functionality is achieved by the configuration of the barrel shifter, which may be generalized as an array of cells, such as thirty-two rows by thirty-two columns. This allows a data stream of thirty-two bits to be rotated by zero to thirty-one bits. The physical implementation of this configuration uses conventional layout designs that are well known and are shown in such textbooks as "Principles of CMOS VLSI Design" by Weste and Eshragian, published by Addison-Wesley, 1993.

Conventional barrel shifters are formed by providing the layout design using mirroring and flipping techniques that are common to many memory devices. In other words, a single cell structure is simply repeated until the desired functionality of the integrated circuit is met. For example, if a barrel shifter that rotates a 2-bit data word is required, then a base cell is copied four times. Each cell comprises a transmission gate made up of an N-type transistor and a P-type transistor, and each transistor is formed in its own active region. Thus a thirty-two bit barrel shifter can have 4096 active regions ($(32)^2 * 4$)).

Current technology trends are driving integrated circuits to operate at higher operating frequencies and lower voltages. These trends, however, are hampered by the performance of conventional barrel shifters due to the parasitic problems associated with a large number of active regions. The large number of active regions results in a net junction capacitance that requires additional current or time to dissipate the capacitance as the barrel shifter is operated. To address the large junction capacitance, previously known barrel shifters are designed so that they either increase the amount of energy consumed, or lengthen their response time by reducing their operational frequency.

Therefore, it would be advantageous to provide an improved barrel shifter that has reduced junction capacitance compared to conventional barrel shifter designs. It would also be advantageous if the barrel shifter could be formed so that the manufacturing cost of an integrated circuit is reduced.

DESCRIPTION OF A PREFERRED EMBODIMENT

In general, the present invention provides a novel integrated circuit layout design for a CMOS (complementary metal-oxide semiconductor) barrel shifter, also known as a rotator, to be used in conjunction with an integrated circuit such as a data processor. The barrel shifter is "layed out" in a plurality of cells in rows and columns. Each of the cells of the barrel shifter is configured in the layout to comprise two transistors. Both transistors of a cell are of the same conductivity type, either N-channel or P-channel, and are formed in a common active region. In addition, within any one row, the transistors in a given cell share the same active region with those of the cell(s) in a neighboring column(s). Thus, all of the transistors within a row are formed in one active region. The number of rows corresponds to the number of bits in the data stream. Exactly half of the rows consist of N-channel transistors, and the remaining rows consist of P-channel transistors. In a preferred embodiment, the rows of N-channel transistors are physically grouped together, as are the rows of P-channel transistors. Where the semiconductor process involves a substrate of one conductivity type and a well region of the opposite conductivity type, only one well region need be defined for the entire shifter. For example, the barrel shifter may be constructed using a P-type substrate with an N-type well region. The N-channel transistor cells are located in the P-type substrate and the P-channel transistor cells are located in the single N-type well region. The layout for the cells in the barrel shifter of the present invention offers several improvements over previously known layout designs. For example, the junction capacitance and the total surface area of the barrel shifter are reduced.

Figure 1:
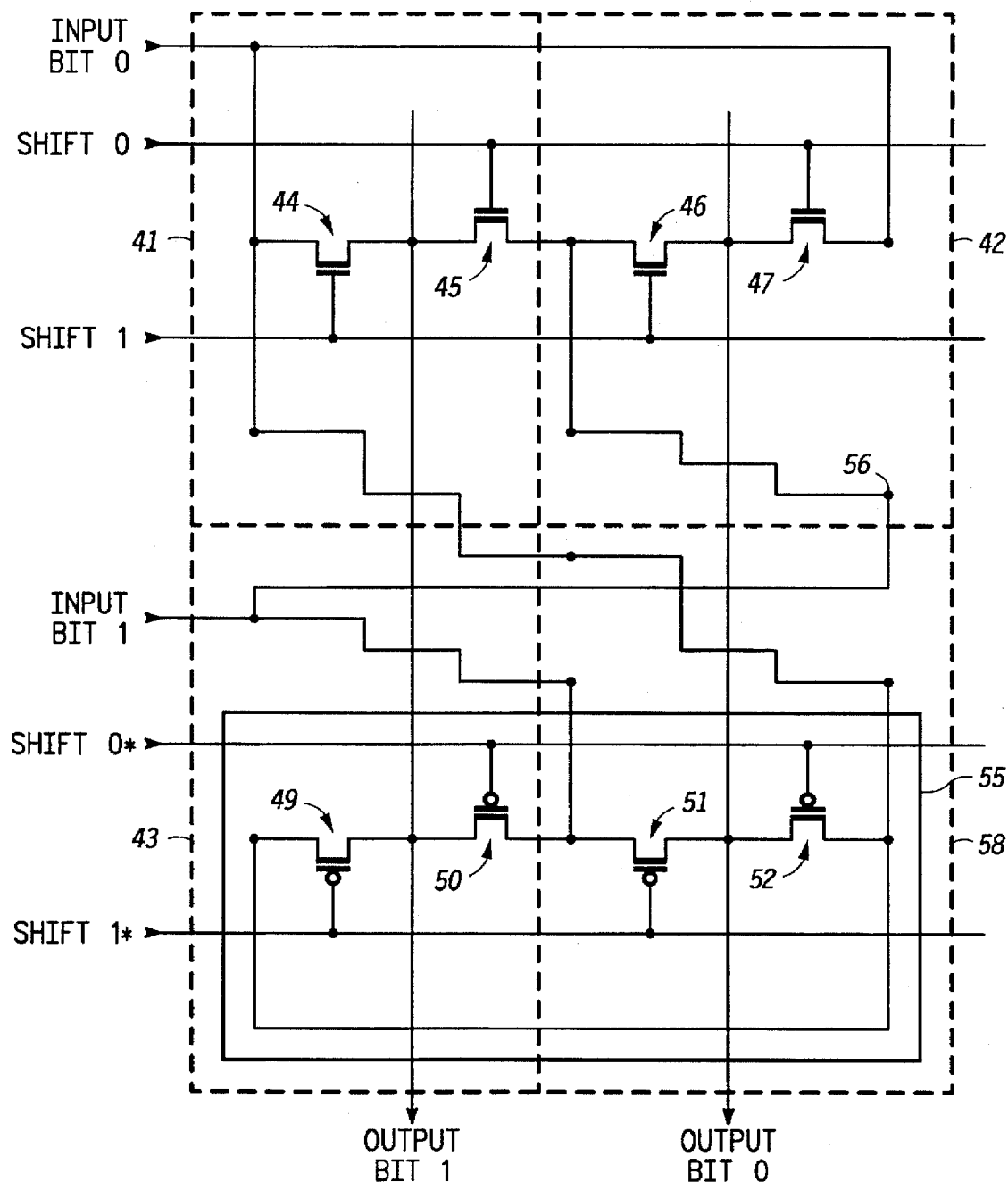
FIG. 1 is schematic representation of a portion of a barrel shifter in accordance with the present invention.
Figure 2:
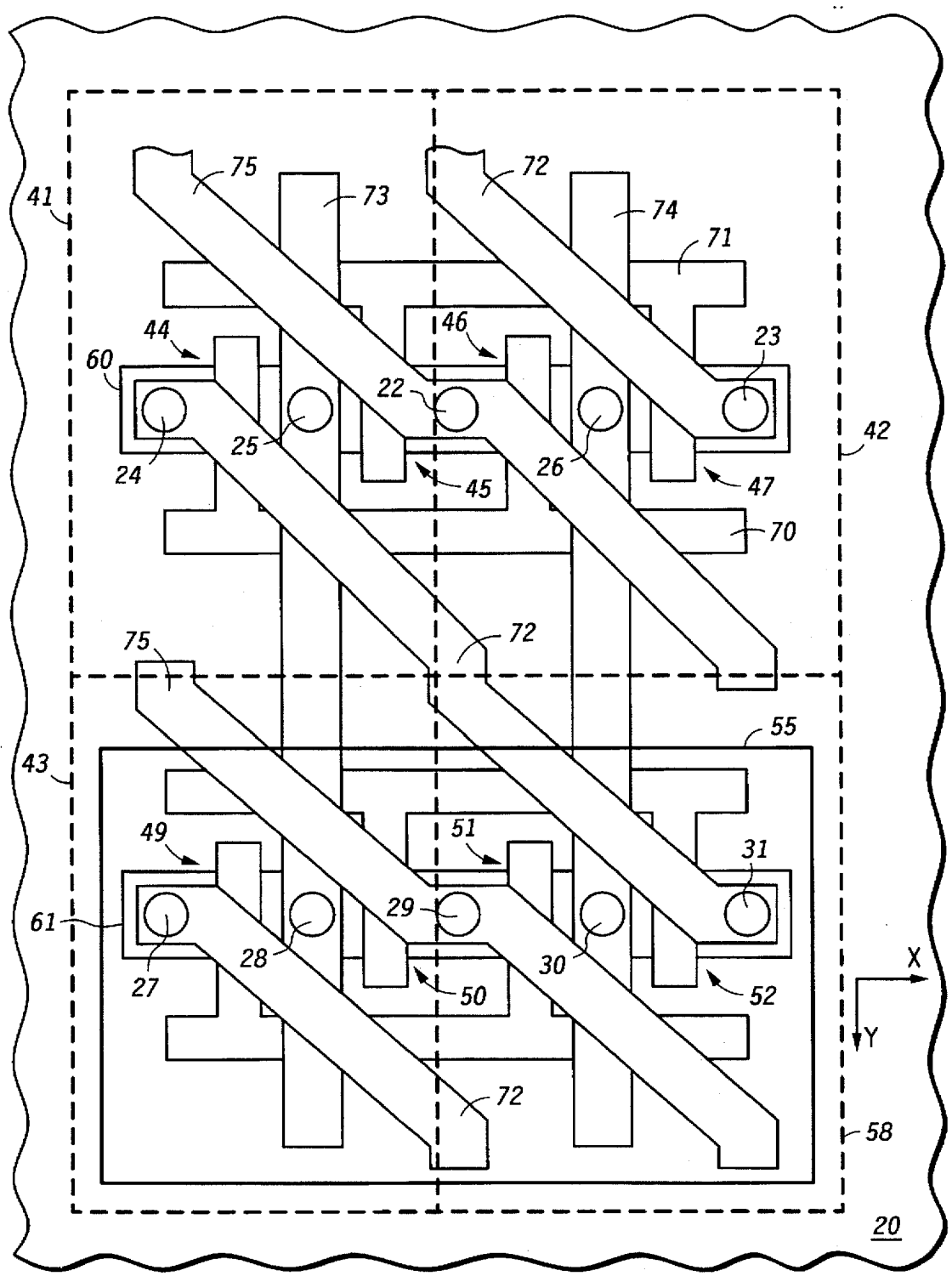
FIG. 2 is an enlarged top plan view of a layout of a portion of the barrel shifter in accordance with the present invention.

FIG. 1 is a schematic representation of a portion of a barrel shifter 40, which can be copied in a repeating pattern to form a barrel shifter that is capable of shifting larger data streams. As shown, barrel shifter 40 comprises four cells 41, 42, 43, and 58 arranged in a two-by-two matrix. Cells 41, 42, 43, and 58 are identified in FIG. 1 with dashed lines. The term "cell" is used in the present application to mean a particular layout structure that can be positioned with other cells to form circuits on a semiconductor substrate. The layout of cells 41, 42, 43, and 58 are substantially identical to each other, except that cells 43 and 58 are formed over a different active region than cells 41 and 42, as illustrated in FIG. 2.

Cells 41 and 42 are arranged in a first row and receive input bit signals INPUT BIT 0 and INPUT BIT 1. Cells 41 and 42 are controlled by shift select lines labeled with the signals names of SHIFT 0 and SHIFT 1. Cells 43 and 58 are arranged in a second row and receive input bit signals INPUT BIT 0 and INPUT BIT 1. Cells 43 and 58 are controlled by shift select lines labeled with the signals names of SHIFT 0* and SHIFT 1*. In the present application, an asterisk (*) is used to indicate that the signal is the logical complement of a signal having the same name but lacking the asterisk (*).

Input bits INPUT BIT 0 and INPUT BIT 1 represent the first and second data bits, respectively, of an input data stream. Select lines SHIFT 0 and SHIFT 1 are used to indicate how many times the bits in the data stream are to be shifted or rotated. In a two-by-two matrix the data stream is shifted by one bit or not shifted at all. It will be understood by one skilled in the art that whether a data stream is shifted to the left or to the right is a matter of convention and that either implementation is possible with the present invention.

Previously known barrel shifters typically are formed so that each repeatable cell in the barrel shifter has a transmission gate comprising both an N-channel transistor and a P-channel transistor. This requires that each repeatable cell include two active regions. However, barrel shifter 40 of the present invention is formed so that each cell has two transistors that are of the same conductivity type, either two N-channel transistors or two P-channel transistors, and each transistor has three terminals: a gate terminal, a drain terminal, and a source terminal. In accordance with the present invention, first cell 41 is comprised of two N-channel transistors 44 and 45. Likewise, cell 42 is comprised of two N-channel transistors 46 and 47. Because transistors 44-47 are of the same conductivity type, they can be formed in a common active region.

Cells 43 and 58 are formed in a well region 55 that is of opposite conductivity type compared to the semiconductor substrate (not shown). For example, if well region 55 defines an area of N-type conductivity, then the transistors used to provide cells 43 and 58 will be P-channel transistors. In particular, cells 43 and 58 are each comprised of P-channel transistors 49, 50, 51, and 52. It should also be understood that if the substrate in which barrel shifter 40 is formed is of the opposite conductivity type as suggested above, then well region 55 could be formed around transistors 44-47 of cells 41 and 42.

FIG. 1 also illustrates a wrap-around feature of barrel shifter 40. As shown, a node 56 is electrically coupled to receive INPUT BIT 1, to one of the current carrying electrodes (i.e., a source or a drain) of transistors 50 and 51, and to one of the current carrying electrodes of transistors 45 and 46. This is so that the input of cell 43 can be coupled or wrapped-around to cell 41 which uses the identical input bit. As shown in FIG. 1, barrel shifter 40 also comprises output signals OUTPUT BIT 1 and OUTPUT BIT 0, which provide the results of the desired shifting of an input data stream.

A transmission gate in barrel shifter 40 includes an N-channel transistor of one cell and a P-channel transistor of another cell. For example, N-channel transistor 44 of cell 41 and P-channel transistor 49 of cell 43 are coupled together to form a transmission gate that is responsive to select lines SHIFT 1 and SHIFT 1*.

FIG. 2 is an enlarged top plan view showing the layout of the portion of barrel shifter 40 shown in FIG. 1 in accordance with the present invention. It should be understood that the same reference numerals are used in the figures to denote the same or similar elements. In the present invention, the active region structure refers to the shape in the layout pattern that is used to define the area on a semiconductor substrate where transistors are formed. This area includes the source region, the channel region, and the drain region of a transistor. In the present invention, transistors within a given row are formed in a common active region so that neighboring transistors share a common source/drain region. Forming multiple transistors in the same active region is sometimes referred to as an active region chain since the active region is divided into a sequence of source and drain regions.

A conventional CMOS manufacturing process can be used to form the structures shown in FIG. 2. Such processes form field effect transistors (FETs) in a semiconductor substrate 20 such as silicon, gallium arsenide, silicon-on-insulator (SOI), or the like. When referring to an SOI substrate, it should be understood that the term semiconductor substrate refers to the portion of the substrate that is used to form the transistors.

The portion of barrel shifter 40 that is shown in FIG. 2 is divided into four cells corresponding to cells 41-43 and 58 shown in FIG. 1. Note that the wraparound lines are not illustrated in FIG. 2 for simplicity and clarity. Transistors 44-47 of cells 41 and 42 are formed in a common active region 60. Preferably, common active region 60 is a continuous region so that transistors 44-47 share common active region 60. This reduces the total number of active regions and any corresponding capacitance associated with the active regions.

The gate electrodes of transistors 44 and 46 are provided by a portion of a gate structure 70 that crosses common active region 60. Gate structure 70 is connected to select control line SHIFT 1 (illustrated in FIG. 1). The gate electrodes of transistors 45 and 47 are provided by a portion of a gate structure 71 that crosses common active region 60. Gate structure 71 is connected to select control line SHIFT 0 (illustrated in FIG. 1).

The first of two current carrying electrodes of transistors 44 and 47 are connected to a diagonal conductor 72 by contacts 24 and 23, respectively. Diagonal conductor 72 also connects contact 24 with contact 31 in cell 58. Although multiple diagonal conductors 72 are shown in FIG. 2, all of diagonal conductors 72 are electrically connected together and are commonly coupled to INPUT BIT 0 to provide the input signal to cells 41 and 42. The second current carrying electrodes of transistors 44 and 47 are connected to conductors 73 and 74, respectively. Conductor 73 provides the output bit OUTPUT BIT 1 of cells 41 and 43 as shown in FIG. 1. Conductor 74 provides the output bit OUTPUT BIT 0 of cells 42 and 58 as shown in FIG. 1.

The first of two current carrying electrodes of transistors 45 and 46 are connected to a diagonal conductor 75 by a contact 22. Although a plurality of diagonal conductors 75 is shown in FIG. 2, all conductors 75 are electrically connected together and are connected to INPUT BIT 1 to provide input signals to cells 41 and 42. The second current carrying electrodes of transistors 45 and 46 are connected to conductors 73 and 74, respectively. It should be understood that conductors 70-75 can be formed using a variety of materials such as metal, polysilicon, amorphous silicon, or numerous equivalents and the use of contacts 22-31 would be considered optional in some manufacturing processes.

Similar connections are made to transistors 49-52 for cells 43 and 58 except that transistors 49-52 are formed in a common active region 61. In addition, transistors 49-52 are formed in a well region 55 that is of opposite conductivity type as semiconductor substrate 20. Contacts 25-31 are used to provide the necessary electrical connections similar to those described above for cells 41 and 42. Transistors 49-52 are formed in common active region 61 to further reduce the number of active regions of barrel shifter 40. In addition, the transistors of cells 41-43 and 58 each contain transistors of the same conductivity type. The result of these layout modifications is that cells 41-43 and 58 of barrel shifter 40 can be formed using two active regions, e.g., common active regions 60 and 61.

The layout of barrel shifter 40 is designed so that it can easily match the pitch of a data bus or an arithmetic logic unit (ALU) (not shown) that may be connected to barrel shifter 40. The smaller minimum size of the layout pattern shown in FIG. 2 can be expanded in the Y-direction to occupy more room if necessary. Additional cells can be added along the X-direction by replicating the pattern shown in FIG. 2, and the transistors for those additional cells can also be formed by expanding common active regions 60 and 61 along the X-direction.

By way of example, a 32 bit CMOS barrel shifter can be layed out using the cells illustrated in FIG. 2. The 32 bit barrel shifter would be arranged into an array of rows and columns of cells. Thirty-two rows of cells are arranged in the X direction and 32 columns of cells are arranged in the Y direction. The top 16 rows would have cells similar to cells 41 and 42 comprising the N-channel transistors of the barrel shifter and the bottom 16 rows would have cells similar to cells 43 and 58 comprising the P-channel transistors of the CMOS barrel shifter. All of the transistors of a row are formed such that they provide a substantially contiguous active region. Diagonal conductors similar to diagonal conductors 72 and 75 would couple the cells together as described above for FIG. 2.

To illustrate the improvement of the present invention, a comparison to the previously described and previously known barrel shifters is provided. As a reminder, the previously known thirty-two bit barrel shifter has 4096 active regions ($(32)^2 * 4$)). Barrel shifter 40 of the present invention can be replicated in both the X and Y directions shown in FIG. 2. Thus, a thirty-two bit barrel shifter can be implemented in accordance with the present invention. A barrel shifter implemented in accordance with the present invention would have 2080 active regions ($(32)^2*2)+32$), resulting in a 49 percent reduction is the number of active regions over a barrel shifter implemented in accordance with the prior art. This 49 percent reduction in active regions reduces the total capacitive value of a barrel shifter formed using the present invention. The reduction in capacitance proportionately reduces the amount of current that is required to operate the barrel shifter and improves its maximum operating frequency. A barrel shifter in accordance with the present invention can also be operated at lower operating voltages, which reduces the amount of energy required by the barrel shifter.

The layout design shown in FIG. 2 also represents a reduction in the total area required to form a four cell barrel shifter when compared to some previously known layout designs. The reduction in area reduces the manufacturing cost of an integrated circuit due to the higher packing density provided by the present invention. In addition, a barrel shifter formed in accordance with the present invention will use fewer contacts to implement each of the cells. The reduction in the number of contacts improves the reliability of the barrel shifter.

By now it should be appreciated that the present invention provides a barrel shifter that can be formed with fewer active regions. As a result, the barrel shifter has reduced junction capacitance compared to previously known barrel shifters. Thus, a barrel shifter in accordance with the present invention consumes less energy and can be operated at a higher frequency. In addition, the layout area of the present invention may be reduced, thus reducing the manufacturing cost of the barrel shifter.

While the invention has been described in the context of a preferred embodiment, it will be apparent to those skilled in the art that the present invention may be modified in numerous ways and may assume many embodiments other than that specifically set out and described above. For example, the input signals and output signals can be switched without altering the configuration or internal connections of the barrel shifter. Accordingly, it is intended by the appended claims to cover all modifications of the invention which fall within the true spirit and scope of the invention.

What is claimed is:

1. A barrel shifter for shifting data, wherein the data has at least a first input bit and a second input bit, the barrel shifter comprising:

a first cell, formed in a first active region, having first and second transistors of a first conductivity type, the first transistor and the second transistor each having a first current electrode, a second current electrode, and a gate electrode, wherein the first current electrode of the first transistor receives the first input bit, the first current electrode of the second transistor receives the second input bit, and the second current electrodes of the first transistor and the second transistor are coupled together to provide an output bit, and the gate electrode of the first transistor receiving a first shift signal and the gate electrode of the second transistor receiving a second shift signal; and a second cell, formed in a second active region different than the first active region, the second cell having third and fourth transistors of a second conductivity type, the third transistor and the fourth transistor each have a first current electrode, a second current electrode, and a gate electrode, wherein the first current electrode of the third transistor receives the first input bit, the first current electrode of the fourth transistor receives the second input bit, and the second current electrodes of the third transistor and the fourth transistor are coupled together to provide the output bit, and the gate electrode of the third transistor receiving a complement of first shift signal and the gate electrode of the fourth transistor receiving a complement of the second shift signal.

2. The barrel shifter of claim 1, wherein the barrel shifter is in a semiconductor substrate that includes the first and second active regions, where the first and second transistors are N-channel transistors and the third and fourth transistors are P-channel transistors.

3. The barrel shifter of claim 2, further comprising a third cell having two N-channel transistors, wherein the two N-channel transistors of the third cell are in the first active region.

4. The barrel shifter of claim 3, further comprising a fourth cell having two P-channel transistors, wherein the two P-channel transistors of the fourth cell are in the second active region.

5. The barrel shifter of claim 4, wherein the semiconductor substrate has a first region of P-type conductivity, and the first active region is in the first region of the semiconductor substrate.

6. The barrel shifter of claim 5, wherein the semiconductor substrate has a second region of N-type conductivity, wherein the second active region is in the second region of the semiconductor substrate.

7. The barrel shifter of claim 6, wherein the semiconductor substrate is of P-type conductivity to provide the first region and the second region is a well region of N-type conductivity.

8. The barrel shifter of claim 6, wherein the semiconductor substrate is of N-type conductivity to provide the second region and the first region is a well region of P-type conductivity.

9. A CMOS integrated circuit barrel shifter comprising a plurality of substantially identical layout cells, the layout cells arranged in an array of rows and columns, the barrel shifter comprising:

a first region formed in a semiconductor substrate;

a first half of the plurality of substantially identical layout cells positioned over the first region, wherein each of the first half of the plurality of substantially identical layout cells includes first and second transistors of a first conductivity type;

a second region formed in the semiconductor substrate; and a second half of the plurality of substantially identical layout cells positioned over the second region, wherein each of the second half of the plurality of substantially identical layout cells includes third and fourth transistors of a second conductivity type different from the first conductivity type;

wherein the first and third transistors are coupled together to form a first transmission gate having an input terminal for receiving a first input bit, an output terminal for providing an output bit, and first and second control terminals for receiving first and second complementary shift signals, and wherein the second and fourth transistors are coupled together to form a second transmission gate having an input terminal for receiving a second input bit, an output terminal coupled to the output terminal of the first transmission gate, and first and second control terminals for receiving third and fourth complementary shift signals.

10. The CMOS integrated circuit barrel shifter of claim 9, wherein the first region is a P-substrate and the second region is characterized as being an N well in the P-substrate.

11. The CMOS integrated circuit barrel shifter of claim 9, wherein the first and second transistors are characterized as being N-channel transistors, and the third and fourth transistors are characterized as being P-channel transistors.

12. The CMOS integrated circuit barrel shifter of claim 9, further comprising a first conductor positioned parallel to the columns of the array for providing the output bit, and second and third conductors positioned parallel to rows of the array for providing the first and second complementary shift signals, respectively.

13. The CMOS integrated circuit barrel shifter of claim 9, wherein a row of the first half of the plurality of substantially identical layout cells are positioned such that transistors of the row form a contiguous active region.

14. A method of forming a CMOS integrated circuit barrel shifter comprising a plurality of substantially identical layout cells, the layout cells arranged in an array of rows and columns, the method comprising the steps of:

forming a first region in a semiconductor substrate;

positioning a first half of the plurality of substantially identical layout cells over the first region, wherein each of the first half of the plurality of substantially identical layout cells includes first and second transistors of a first conductivity type;

forming a second region in the semiconductor substrate; and positioning a second half of the plurality of substantially identical layout cells over the second region, wherein each of the second half of the plurality of substantially identical layout cells includes third and fourth transistors of a second conductivity type different from the first conductivity type;

wherein the first and third transistors are coupled together to form a first transmission gate having an input terminal for receiving a first input bit, an output terminal for providing an output bit and first and second control terminals for receiving first and second complementary shift signals, and wherein the second and fourth transistors are coupled together to form a second transmission gate having an input terminal for receiving a second input bit, an output terminal coupled to the output terminal of the first transmission gate, and first and second control terminals for receiving third and fourth complementary shift signals.

15. The method of claim 14, wherein the semiconductor substrate is of the first conductivity type and the method further comprises the step of forming a well region of the second conductivity type in the semiconductor substrate, wherein the first region is in the well region of the second conductivity type.

16. The method of claim 14, wherein the semiconductor substrate is one of a silicon substrate, a gallium arsenide substrate, or a silicon-on-insulator substrate.

17. The method of claim 14, wherein the step of positioning a first half further comprises positioning a row of the first half of the plurality of substantially identical layout cells such that transistors of the row form a contiguous active region.

\* \* \* \* \*